United States Patent [19]
Proebster

[11] Patent Number: 5,091,797
[45] Date of Patent: Feb. 25, 1992

[54] METHOD AND APPARATUS FOR MODULATION CURRENT REGULATION FOR LASER DIODES

[75] Inventor: Walter Proebster, Munich, Fed. Rep. of Germany

[73] Assignee: Siemens Aktiengesellschaft, Berlin, Fed. Rep. of Germany

[21] Appl. No.: 581,576

[22] Filed: Sep. 11, 1990

[30] Foreign Application Priority Data

Nov. 13, 1989 [DE] Fed. Rep. of Germany ....... 3937747

[51] Int. Cl.⁵ .............................................. H04B 10/04
[52] U.S. Cl. ...................................... 359/187; 359/181
[58] Field of Search .............................. 455/609–611, 455/613, 618; 372/29, 31; 359/181, 187

[56] References Cited

U.S. PATENT DOCUMENTS 4,009,385  2/1977  Sell ...................................... 455/611

FOREIGN PATENT DOCUMENTS 0151040  7/1987  Japan ................................... 455/618

OTHER PUBLICATIONS

Smith, D. W.; "Laser Level-Control Circuit for High--Bit-Rate Systems Using a Slope Detector", Electronics Letters, vol. 14, No. 4, Nov. 23, 1978, pp. 775–776.

Primary Examiner—Reinhard J. Eisenzopf
Assistant Examiner—L. Pascal
Attorney, Agent, or Firm—Hill, Van Santen, Steadman & Simpson

[57] ABSTRACT

In known modulation current regulators, a low-frequency pilot signal is often superimposed on the digital useful signal and the two superposition products resulting in a light signal are evaluated. Due to the cut-in delay of a laser diode, the preconduction current of the laser diode in laser diode transmitters having transmission rates of at least a few 100 Mbit/s must be set so high that a superposition product only results in the light output signal and, therefore, a regulation of the modulation current is no longer possible in the known manner. For regulating the modulation current given high transmission rates, at least one pulse sequence is periodically inserted into the digital transmission signal or a pulse sequence already contained in the digital transmission signal is evaluated, the pulse sequence being composed of at least one part having a majority of logical one pulses and a part having a majority of logical zero pulses.

7 Claims, 2 Drawing Sheets

METHOD AND APPARATUS FOR MODULATION CURRENT REGULATION FOR LASER DIODES

BACKGROUND OF THE INVENTION

1. Field of the Invention

The present invention relates to a method and to apparatus for regulating the modulation current of laser diodes.

2. Description of the Prior Art

When using laser diodes as optical transmitters in light wave guide transmission systems, the operating point of these components must be kept constant vis-a-vis aging and temperature changes on the basis of a suitable regulation method. Since the characteristic of the laser diodes generally employed has a noticeable threshold, the regulation of the operating point of a laser diode is composed of regulating a preconduction current and of regulating the modulation current superimposed on the preconduction current in the characteristic region of the actual laser emission above the threshold. Both the threshold current of the laser diode and the slope of the characteristic above the threshold are subject to variation caused by aging and temperature and therefore require a corresponding readjustment of the preconduction current and the modulation current. For regulating the operating point, a portion of the generated light is usually converted into an electrical signal with a monitor photodiode that is optically coupled to the laser diode and this electrical signal is used for generating a control signal. In a less-involved regulation, the preconduction current is thereby adjusted via the evaluation of the average light output power and the modulation current is held constant while foregoing a regulation of the modulation current.

According to FIG. 1, in a method for regulating the operating point of laser diodes described by Smith in the publication Electronics Letters, Vol. 14, 1978, pp. 775–776, a relatively low-frequency pilot current PSI is superimposed on the modulation current MI, the pilot current PSI effecting a corresponding pilot signal portion PSL in the generated light. An accurate stabilization of the operating point of the preconduction current results with this method in the region of the threshold current, as does an adjustment of the light signal amplitude by regulating the modulation current on the basis of a combined evaluation of the average light output power as well as of the evaluation of the characteristic slope at the operating point.

Further developments of digital signal transmission have yielded useful digital signals having bit rates in the Gigabit/s region, whereby disturbance can result due to cut-in delays and relaxation resonance of the laser diode insofar as the preconduction current is set below the range of the threshold current. The known and proven method of relative evaluation of characteristic slope does not come into consideration for this characteristic operating range because the preconduction current must be set above the threshold current range.

One possibility for regulating laser transmitters for useful signals in the Gigabit/s range is the regulation of only the preconduction current given a constant modulation current or in combination with a simplified regulation of the modulation current. Difficulties can thereby result, however, in that the characteristic slope is changed due to an aging of the laser diode and nonlinear changes in characteristics can also occur. A direct evaluation of the light signal amplitude of the digital useful signal is, in fact, conceivable, but requires a comparatively-high expense, particularly for the regulation of the modulation current, because of the high-frequency bandwidth of the useful digital signal, whereas the regulation of the preconduction current can occur with known methods.

SUMMARY OF THE INVENTION

The object of the present invention, therefore, is to provide a method and apparatus for the implementation of a method for regulating the modulation current of laser diodes in the gigabit range.

The above object is achieved, according to the present invention, by a regulating method of the type initially set forth that is improved in that the method is characterized in that the digital transmission signal periodically contains at least one pulse sequence that contains one or more parts in which the logical zero pulses or the logical one pulses predominate, so that an electrical signal generated by the monitor photodiode contains a pulse signal having a constant amplitude and fixed cycle return that yields a comparatively low-frequency signal part, and in that a setting signal for regulating the modulation current is generated from the amplitude value thereof by comparison to a reference value.

Of particular advantage in practicing the method of the present invention is the possibility of being able to work with signals whose frequency lies 1-2 powers of 10 below the pulse repetition rate of the digital useful signals. A preferred embodiment of the method of the present invention that makes use of the low-frequency component occurring in the digital signal and is especially less complicated as a result thereof is that the above-mentioned method is further particularly characterized in that the pulse sequence contains alternating parts having elevated proportions of logical one pulses or zero pulses.

Advantageous methods for the evaluation of the electrical signal generated by the monitor photodiode are obtained with the above-described method that is further particularly characterized in that the signal pulse periodically contained in the digital transmission signal is the unscrambled frame identifier sequence of the digital transmission signal, and is further particularly characterized in that the generation of the setting signal for the regulation of the modulation current occurs by synchronous detection of the electrical signal generated by the monitor photodiode and the comparison to a reference value.

The method, according to the present invention as initially set forth above is characterized in that the generation of the setting signal for regulating the modulation current from the electrical signal generated by the monitor photodiode occurs on the basis of synchronized, periodic sampling of the signal and integrated of the samples in the matter of what is referred to as the sample-and-hold method.

According to the present invention, an arrangement for implementing the method which is characterized by the generation of the setting signal for the regulation of the modulation current by synchronous detection of the electrical signal generated by the monitor photodiode and the comparison to a reference value, is characterized in that a first photoamplifier is provided whose input terminal is connected to the monitor photodiode of the optical transmitter and whose output terminal is connected to the one input terminal of a first mixer, in that a low-pass filter is provided whose input terminal is connected to a terminal of the optical transmitter that carries the transmission signal and whose output terminal is connected to the second terminals of the first and of a second mixer, in that the first output terminal of the first mixer is connected to the second output terminal of the second mixer, to a terminal of a following regulator and to a reference potential via a first resistor and via a first capacitor, in that the second output terminal of the first mixer is connected to the first output terminal of the second mixer and to a further terminal for the following regulator and to a reference potential via a second resistor and a second capacitor, in that the first input terminal of the second mixer is connected to the output of the low-pass filter via a third, variable resistor, in that the control inputs of a first control switch and of a second control switch are connected to a terminal for a gate pulse, in that the signal input of the first control switch is connected to a first current source and the signal input of the second control switch is connected to a second current source, and in that the signal output of the first control switch is connected to a common terminal of a first differential amplifier and the signal output of the second control switch is connected to a common terminal of a second differential amplifier.

An arrangement for implementing the above method, and according to the present invention and the above-recited arrangement, is particularly characterized in that the input of a second photocurrent amplifier is connected to a terminal of the monitor photodiode of the optical transmitter, in that the output of the second photocurrent amplifier is connected to the signal input of a first sample-and-hold circuit and a second sample-and-hold circuit, in that the control input of the first sample-and-hold circuit is connected to a first terminal for a first synchronous pulse and the control input of the second sample-and-hold circuit is connected to a second terminal for a second synchronous pulse, and in that the output of the first sample-and-hold circuit is connected to the non-inverting input of an opertional amplifier and the output of the second sample-and-hold circuit is connected to the inverting input of the operational amplifier at whose output a terminal of the regulating device for the modulation current of the laser diode is connected.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
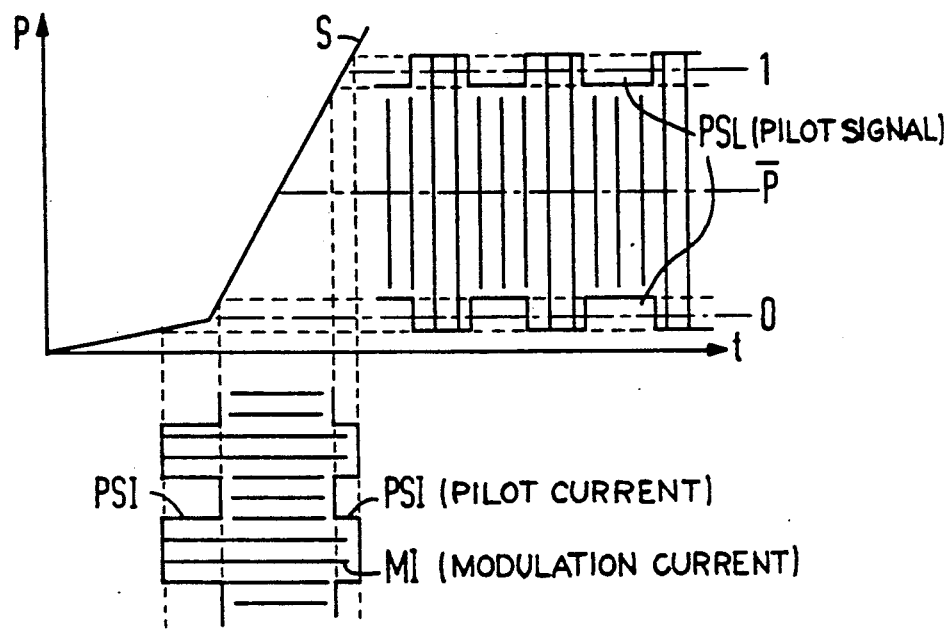
FIG. 1 is a graphic illustration showing the principle of pilot signal regulation of light transmitters constructed with laser diodes.

FIG. 1 has already been discussed above with respect to the prior art and shall not be discussed in greater detail herein.

Figure 2:
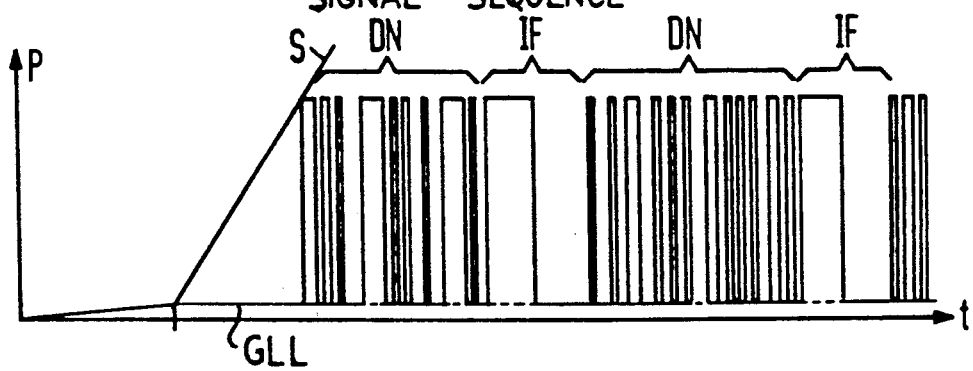
FIG. 2 is a graphic illustration of the light signal generated in the laser regulation according to the present invention.

FIG. 2 is a simplified graphic illustration of a laser diode characteristic S and of the pulse-shaped light signal generated by a laser diode about the ambient light or, respectively, constant light line GLL. The light signal represents the digital transmission signal that is composed of the digital useful signal DN and of a periodically-appearing pulse sequence IF and that is transmitted with non-return-to-zero (NRZ) pulses. The illustration has thereby been simplified insofar as the pulse sequence IF, divided for regulating the modulation current, does not really appear so short-period like and likewise does not have such a large portion of the transmission signal in comparison to the digital useful signal DN. It may be seen from FIG. 2 that, contrary to the pulses of the digital useful signal that appeared in a pseudo-random manner, the pulse sequence provided for regulation always has the same structure; in the exemplary embodiment, it is a respective block composed of a plurality of logical "1" pulses followed by a plurality of logical "0 pulses". It may also be seen from FIG. 2 that the amplitudes of the logical "1" pulses are the same as those of the pulses of the digital useful signal DN; the amplitude of the pulse sequence IF is therefore a direct measure for the modulation boost at the laser diode, the pulse frequency thereby appears with a noticeably lower frequency in comparison to the digital useful signal DN and, therefore, is easier to evaluate than the digital useful signal DN.

The pulse sequence IF provided for the regulation of the modulation current can be periodically mixed into the digital transmission signal in free channels thereof; and especially advantageous and simple possibility, however, is the utilization of an unscrambled pulse sequence already periodically contained in the digital transmission signal that has greatly different proportions of logical "0" and "1" pulses, as is possible on the new international digital signal hierarchy according to the CCITT recommendations G.707, G.708 and G.709 that is referred to as SONET. A respective frame that lasts 125 μs is provided at the hierarchy levels STM-1, STM-4, and STM-16 in this digital signal hierarchy, the beginning of this frame having a sequence of unscrambled frame identifiers for the duration of approximately 310 ns. The frame identifier sequence is thereby composed of a plurality of first frame identifiers A1 followed by a plurality of second frame identifiers A2. The frame identifiers thereby comprise the structure:

| A1: | 1 | 1 | 1 | 1 | 0 | 1 | 1 | 0 |
|---|---|---|---|---|---|---|---|---|
| A2: | 0 | 0 | 1 | 0 | 1 | 0 | 0 | 0. |

It may be seen that the first frame identifier A1 has a majority of logical "1" pulses, whereas the second frame identifier A2 is predominantly composed of logical "0" pulses, so that the combination of the two frame indentifiers yields a pulse sequence that contains a majority of logical "1" pulses in one part and contains a majority of logical "0" pulses in the other part.

In the first SONET hierarchy level referenced STM-1, a digital transmission signal is transmitted with a bit rate of 155 Mbit/s; the frame identifier sequence is composed of three first frame identifiers A1 followed by three second frame identifiers A2. Given a bit interval of approximately 6.5 ns, a total of approximately 310 ns results as a period for the 48 bit positions of the frame identifier sequence.

In the second SONET hierarchy level referred to as STM-4, the digital transmission signal has a bit rate of 622 Mbit/s; the unscrambled frame identifier sequence is composed of 12 first frame identifiers A1 and of 12 second frame identifiers A2, so that a pulse signal having a period of approximately 310 ns likewise results.

The third SONET hierarchy level referred to as STM-16 relates to a digital transmission signal of 2.5 Gbit/s; the frame identifier sequence is composed of 48 first frame identifiers A1 and of the same number of second frame identifiers A2, so that a pulse signal having a duration of approximately 310 ns also results in this case, this appearing after respectively 125 $\mu$s. A low-frequency signal part is thus contained in the light emitted by the laser diode. The evaluation thereof along a simple regulation of the modulation current amplitude of the laser diode.

Figure 3:
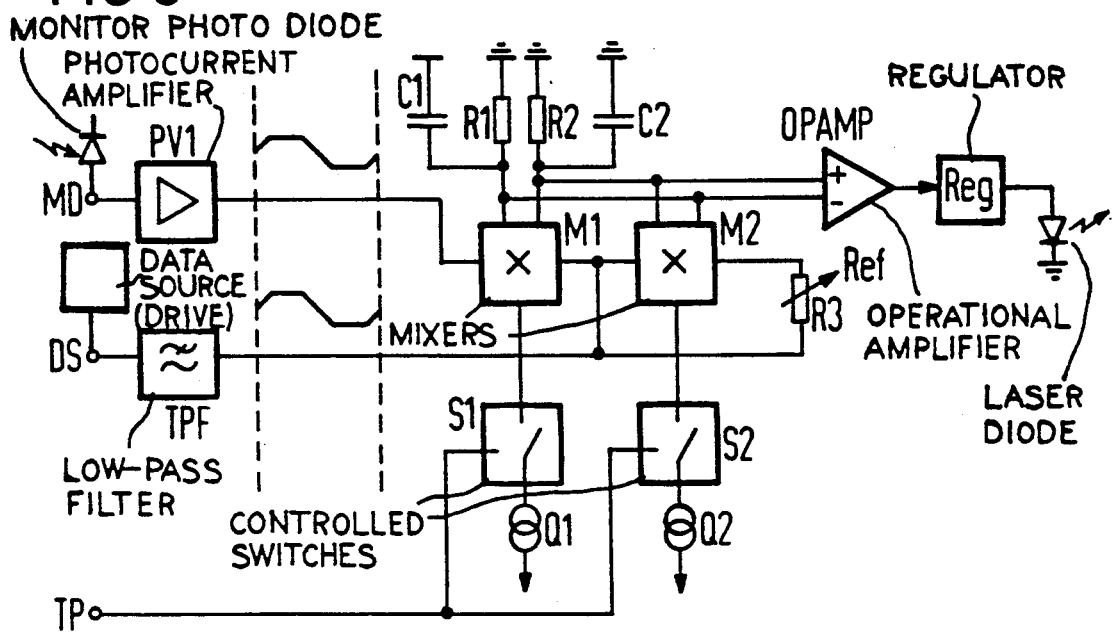
FIG. 3 is a schematic representation of a first arrangement for evaluating the electrical signal generated by the monitor photodiode using a synchronous detector.
Figure 4:
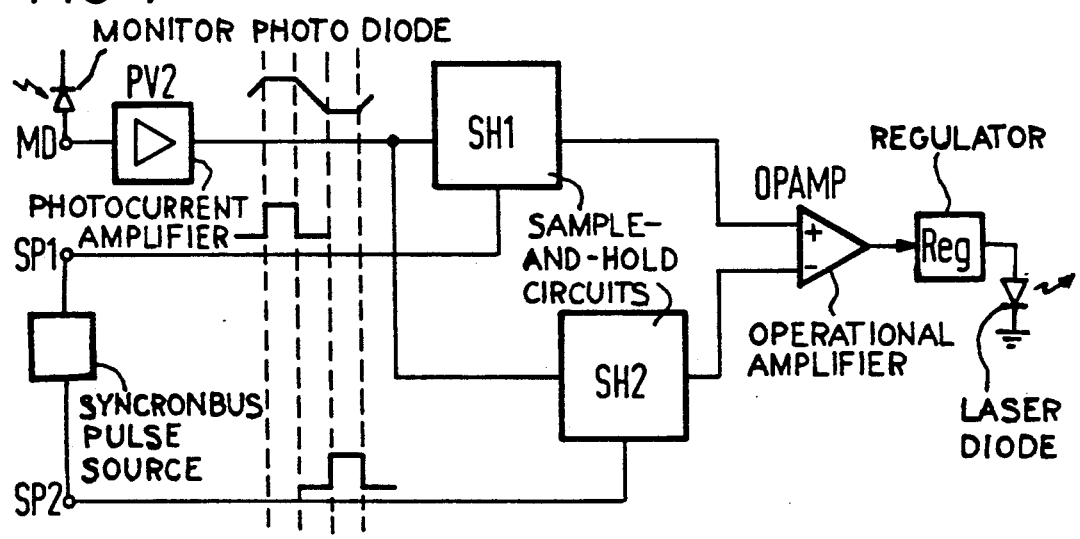
FIG. 4 is a schematic representation of a further arrangement for the evaluation of the electrical signal generated by the monitor photodiode using sample-and-hold circuits.

The evaluation of the light signal amplitude can occur with synchronous detection in accordance with FIG. 3 or with sample-and-hold circuits in accordance with FIG. 4.

The evaluation circuit illustrated in FIG. 3 for the light signal amplitude comprises a first photocurrent amplifier PV1 whose input is connected to the monitor photodiode MD and at whose an electrical signal corresponding to the light signal is available, this being supplied to a first input of a first push-pull mixer M1. The evaluation circuit is also connected vi a low-pass filter TPF to a terminal DS for the digital signal that modulates the laser diode; the output of the low-pass filter TPF is connected to a second input of the first push-pull mixer M1, whereas the first and second current output terminals of the mixer M1 are connected to a reference potential, here ground, by way of a first resistor R1 and a second resistor R2, respectively, and a first capacitor C1 and a second capacitor C2, respectively, connected parallel thereto. The common current terminal of the mixer M1, i.e. for example, the combined emitter terminals of an emitter-coupled transistor mixer, are connected to the output terminal of a first controlled switch S1 whose input terminal is connected to a first current source Q1 and whose control input is connected to a terminal TP for a gate pulse. With respect to its chronological appearance and its duration, this gate pulse corresponds to the pulse sequence IF in the light output signal of the laser diode, i.e. to the duration DRKW of the same identifier sequence of the SONET system STM-1, STM-4 or STM-16 provided for the transmission. The second input of the second push-pull mixer M2 is also directly connected to the output terminal for the low-pass filter TPF and the first input of the second mixer M2 is connected via a third, variable resistor R3 to the output of the low-pass filter TPF. The setting of a reference voltage and, therefor the setting of the desired modulation of the laser diode is possible on the basis of this third, variable resistor R3. The two output terminals of the second mixer M2 are connected crossed to the output terminals of the first mixer M1 and to an opertional amplifier OPAMP to whose output a control terminal of the modulation current regulator Reg is connected. Corresponding to the first mixer M1, the combined terminals of the second mixer M2 are also connected to the output of a second controlled switch S2 whose input terminal is connected to a second current source Q2 and whose control input is connected to the terminal TP for the gate pulse.

The synchronous detection occurs such that the first controlled switch S1 and the second control switch S2 are closed by the gate pulse having a duration of approximately 310 ns and, therefore, the first mixer stage M1 and the second mixer stage M2 are activated in an anti-phase manner. The first mixer stage M1 executes the synchronous detection of the light value generated by the laser diode having the value applied to the laser diode, whereby the second mixer stage M2 executes the formation of a reference signal via the modulation signal itself that is available at the laser diode. The formation of the mean value of the synchronous detection, clocked with the gate pulse, thereby occurs in the output circuit of the synchronous detector.

FIG. 4 illustrates an evaluation circuit of the light signal amplitude with sample-and-hold circuits. The monitor photodiode MD is thereby connected via a second photoamplifier PV2 to the inputs of a first sample-and-hold circuit SH1 and a second sample-and-hold circuit SH2, each of which being commercially-available circuits. At the required frequency band width of approximately 20 MHz, the photoamplifiers, as well as the sample-and-hold circuits, can be advantageously constructed with discrete microwave semiconductor components. The control inputs of these two sample-and-hold circuits are also connected to terminals SP1, SP2 for synchronous pulses. In terms of their chronological position, the synchronous pulses thereby maximally correspond to the parts of the pulse sequence IF, i.e. either the part in which the logical "0" predominates or the part in which the logical "1" pulses predominate. For protection against overlap, it is thereby expedient to shorten the synchronous pulses to such an extent that the duration of a synchronous pulse is noticeably shorter than half the duration of the pulse sequence IF or, respectively, than half the duration of the gate pulse TP of FIG. 3.

In the exemplary embodiment, the first sample-and-hold circuit SH1 was supplied with a first synchronous pulse SP1 that is effective during the logical "1" pulses in the pulse sequence IF, whereas the second sample-and-hold circuit SH2 is supplied with a second synchronous pulse SP2 that is effective during the duration of the part of the pulse sequence IF that is predominantly composed of logical "0" pulses. Similar to FIG. 3, the output of the first sample-and-hold circuit SH1 is connected to the noninverting input of the operational amplifier OPAMP and the output of the second sample-and-hold circuit SH2 is connected to the inverting input of the operational amplifier OPAMP at whose output the control terminal for the modulation current regulator Reg is connected.

The evaluation of the light signal amplitude in the time identifier with sample-and-hold circuits therefore occurs on the basis of synchronization pulses controlled isochronically with the transmitted frame identifier sequence. The formation of the mean value and the comparison of the amplitude references thereby occurs in the following operational amplifier that need only be effective for the LF range.

Circuits that correspond in their operative range to the great frequency range of the digital useful signal can be very advantageously foregone in FIGS. 3 and 4; even given a transmission signal corresponding to the SONET hierarchy level STM-16, i.e. a transmission rate of 2.5 Gbit/s, an operative bandwidth of 20 MHz is adequate for the photocurrent amplifiers, sample-and-hold circuits, differential amplifiers and controlled switches that are employed.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for regulating the modulation of a laser diode used as an optical transmitter in a high bit rate digital communications transmission system, comprising the steps of:
   (a) converting, with a monitor diode, a portion of the light emitted by the laser diode into an electrical signal;
   (b) transmitting a digital signal with the laser diode such that the transmission signal periodically comprises at least one pulse sequence which contains a predominance of pulses of one logical state selected from the group consisting of logical zero pulses and logical one pulses so that the electrical signal generated by the monitor diode contains a pulse signal having a constant amplitude and a fixed cycle return that yields a comparatively low-frequency signal part; and
   (c) generating a setting signal for regulating the modulation current by (c1) comparing the amplitude value of the pulse signal to a reference value.

2. The method of claim 1, wherein the step (b) of transmitting is further defined as:
   (b1) transmitting said digital signal with the laser diode in which the pulse sequence contains alternate parts having greater portions of logical one pulses or logical zero pulses.

3. The method of claim 1, wherein the step (b) of transmitting is further defined as:
   (b1) transmitting an unscrambled frame identifier sequence of the digital transmission signal as the pulse signal periodically contained in the digital transmission signal.

4. The method of claim 1, wherein the step (c) of generating the setting signal is further defined by the step of:
   (c2) prior to the step (c1) of comparing the amplitude value of the pulse signal to a reference value, detecting the electrical signal generated by the monitor photodiode.

5. A method for regulating the modulation current of a laser diode used an optical transmitter in a high bit rate digital communications transmission system, comprising the steps of
   (a) converting, with a monitor diode, a portion of the light emitted by the laser diode into an electrical signal;
   (b) transmitting a digital signal with the laser diode such that the transmission signal periodically comprises at least one pulse sequence which contains a predominance of pulses of one logical state selected from the group consisting of logical zero pulses and logical one pulses so that the electrical signal generated by the monitor diode contains a pulse sequence having a constant amplitude and a fixed cycle return that yields a comparatively low-frequency signal part; and
   (c) generating a setting signal for regulating the modulation current by (c1) periodically sampling the electrical signal during the logical "1 pulses" and periodically sampling the electrical signal during the logical "0 pulses",
   (c2) integrating the sampled logical "1 pulses" and the sampled logical "0 pulses" to produce a logical "1" and a logical "0" comparison signal, and
   (c3) comparing the integrated logical "1" comparison signals and the integrated logical "0" comparison signals to produce said setting signal.

6. An arrangement for regulating the modulation current of a laser diode used as an optical transmitter in a high bit rate digital communications transmission system, comprising:
   a monitor photodiode operable to receive and convert a portion of the light emitted by the laser diode into an electrical signal;
   drive means for operating the laser diode to produce a digital transmission signal for said laser diode that periodically comprises at least one pulse sequence that contains at least one part of predominantly one type of logical pulses selected from the group consisting of logical pulses and logical one pulses such that said electrical signal comprises a pulse signal comprising a constant amplitude and a fixed cycle return that yields a comparatively low-frequency signal part, said drive means including;
   a low-pass filter including an input and an output, said input connected to receive said digital transmission signal;
   first and second mixers, each of said mixers including a signal input, a common input and first and second outputs;
   said output of said low-pass filter connected to said signal input of said first mixer;
   regulating means for producing a setting signal for regulating the modulation current of said laser diode, said regulating means including first and second inputs, and an output for providing said setting signal;
   a first resistor connected to a reference potential;
   a second resistor connected to the reference potential;
   a first capacitor connected in parallel with said first resistor;
   a second capacitor connected in parallel with said second resistor;
   said first output of said first mixer connected to said second output of said second mixer, to said second input of said regulating means, and to said reference potential via said first resistor and said first capacitor;
   said second output of said first mixer connected to said first output of said second mixer, to said first input of said regulating means and to said reference potential via said second resistor and said second capacitor;
   a third, variable resistor;
   said first input of said second mixer connected to said output of said low-pass filter via said third, variable resistor;
   a first controlled switch including an input, a control input and an output;
   a second controlled switch including an input, a controlled input and an output;

a first current source including an output connected to said input of said first control switch;

a second current source including an output connected to said input of said second control switch; and said control input of said first and second controlled switches connected to receive gate pulses having a period approximately equal to the duration of the pulse sequence.

7. An arrangement for regulating the modulation current of a laser diode used as an optical transmitter in a high bit rate digital communications transmission system, comprising:

a monitor photodiode operable to receive and convert a portion of the light transmitted by the laser diode into an electrical signal;

drive means for operating the laser diode to produce a digital transmission signal for said laser diode that periodically comprises at least one pulse sequence that contains at least one part predominantly one type of logical pulses selected from the group consisting of logical zero pulses and logical one pulses such that said electrical signal comprises a pulse signal comprising a constant amplitude and a fixed cycle return that yields a comparatively low-frequency signal part, said drive means including;

a photo current amplifier including an input connected to said monitor photodiode, and an output;

first and second sample-and-hold circuits each including an input connected to said output of said photoamplifier, and an output;

regulating means including a first input, a second input and an output for providing a regulating current for the laser diode;

each of said sample-and-hold circuits including a control input for receiving first and second synchronous pulses, respectively, said first synchronous pulses causing said first sample-and-hold circuit to sample and integrate logical one pulses of the pulse sequence and said second synchronous pulses operable to cause said second sample-and-hold circuit to sample and integrate during said logical zero pulses; and said regulating means including means for comparing the integrated logical one and logical zero pulses to produce the regulating current.

* * * * *